United States Patent [19]

Hase et al.

[11] Patent Number: 5,281,575
[45] Date of Patent: Jan. 25, 1994

[54] LASER ABLATION METHOD FOR FORMING OXIDE SUPERCONDUCTING FILMS

[75] Inventors: Takashi Hase; Tadataka Morishita; Katsumi Ohata; Hirohiko Izumi, all of Tokyo, Japan

[73] Assignees: International Superconductivity Technology Center, Tokyo; Kabushiki Kaisha Kobe Seiko Sho, Kobe; Hitachi Densen Kabushiki Kaisha, Tokyo, all of Japan

[21] Appl. No.: 848,004

[22] PCT Filed: Aug. 15, 1991

[86] PCT No.: PCT/JP91/01086
§ 371 Date: Apr. 21, 1992
§ 102(e) Date: Apr. 21, 1992

[87] PCT Pub. No.: WO92/03376
PCT Pub. Date: Mar. 5, 1992

[30] Foreign Application Priority Data
Aug. 21, 1990 [JP] Japan .................. 2-220466

[51] Int. Cl.⁵ .................. B05D 3/06; B05D 5/12
[52] U.S. Cl. .................. 505/1; 505/732; 505/730; 427/62; 427/596; 427/557; 427/314; 427/126.3
[58] Field of Search .................. 505/732, 730; 427/62, 427/63, 596, 314, 557, 126.3

[56] References Cited

U.S. PATENT DOCUMENTS

| | | | |
|---|---|---|---|
| 4,743,463 | 5/1988 | Ronn et al. | 427/597 |
| 4,970,196 | 11/1990 | Kim et al. | |
| 4,987,006 | 1/1991 | Williams et al. | 427/597 |

FOREIGN PATENT DOCUMENTS

| | | |
|---|---|---|
| 1-179473 | 7/1989 | Japan . |
| 2-17685 | 1/1990 | Japan . |
| 2-88409 | 3/1990 | Japan . |
| 2-197565 | 8/1990 | Japan . |
| 2-250222 | 10/1990 | Japan . |

OTHER PUBLICATIONS

Koren et al, "Highly oriented as deposited superconducting laser ablated thin films of $YiBa_2Cu_3O_{7-\delta}$ on $SrTiO_3$, zirconia, and $S_i$ substrates", Appl. Phys. Lett. 53(23) Dec. 1988, pp. 2330–2332.

Journal of Applied Physics, vol. 66, No. 1, Jul. 1, 1989, pp. 457–459, E. Fogarassy, et al., "Laser–Induced Forward Transfer of High–Tc YBaCuO and BiSrCaCuO Superconducting Thin Films".

Primary Examiner—Roy King
Attorney, Agent, or Firm—Oblon, Spivak, McClelland, Maier & Neustadt

[57] ABSTRACT

In manufacturing a high-temperature superconductive oxide thin film by irradiating a laser beam onto an oxide target in an atmosphere of oxygen to form the high-temperature superconductive oxide thin film on an oxide substrate, the laser beam is irradiated from a back surface of the substrate and is transmitted through the substrate, and thereafter the laser beam is irradiated onto the oxide target.

6 Claims, 4 Drawing Sheets

LASER ABLATION METHOD FOR FORMING OXIDE SUPERCONDUCTING FILMS

TECHNICAL FIELD

The present invention relates to a thin-film technology for an oxide superconductor, and more particularly to a manufacturing method for a high-temperature superconductive oxide thin film wherein a laser beam is irradiated onto a target to heat and evaporate oxide particles on the target and form the oxide thin film on a substrate.

BACKGROUND ART

FIG. 2 is a schematic diagram illustrating a manufacturing method for a high-temperature superconductive oxide thin film by means of laser. In this method, a laser beam 1 oscillated from a laser device (not shown) such as a YAG laser device or an ArF excimer laser device is obliquely irradiated onto a target 2 provided with an oxide for formation of a thin film to cut the bond of particles constituting the target and simultaneously excite the particles to a high energy state. Then, a luminous region called a plume consisting of active evaporated particles is formed, and when the plume reaches a substrate 3 heated by a heater 4 or the like, a high-temperature superconductive thin film is obtained.

In general, it is considered to be desirable that an oxygen partial pressure during film formation is made high from the viewpoint of improvement in Tc end of a superconductive oxide thin film. However, when the oxygen partial pressure during film formation is high, the plume is reduced in shape, resulting in a low probability of reaching of the active particles to the substrate. To cope with this, it is considered that a distance between the target and the substrate is reduced to allow the plume to easily reach the substrate. However, this method cannot be adopted because it is necessary to define a given distance between the target and the substrate so as to irradiate the laser beam onto the target.

Accordingly, as an adoptable method, the oxygen partial pressure is reduced during film formation, and after forming the thin film, a post-treatment is carried out such as by cooling and maintaining the thin film in the atmosphere of oxygen to incorporate oxygen particles into the thin film, thereby improving Tc end.

In this method, however, when a crystal structure is modified from a tetragonal system to an orthorhombic system by the incorporation of the oxygen particles into the thin film, a twin plane is formed to relax a strain of a lattice constant. It is known that the twin plane generates a magnetic flux trap to cause a noise in case of practically applying the superconductive thin film to a superconductive device.

DISCLOSURE OF INVENTION

The present invention has been accomplished in view of the above circumstances, and it provides a manufacturing method for a high-temperature superconductive oxide thin film wherein the superconductive oxide thin film is formed under a high oxygen partial pressure to obtain a high Tc end without a post-treatment of cooling and maintaining the thin film in the atmosphere of oxygen, and no noise is generated in the case that the superconductive oxide thin film is practically applied to a superconductive device.

BEST MODE FOR CARRYING OUT THE INVENTION

Figure 1:
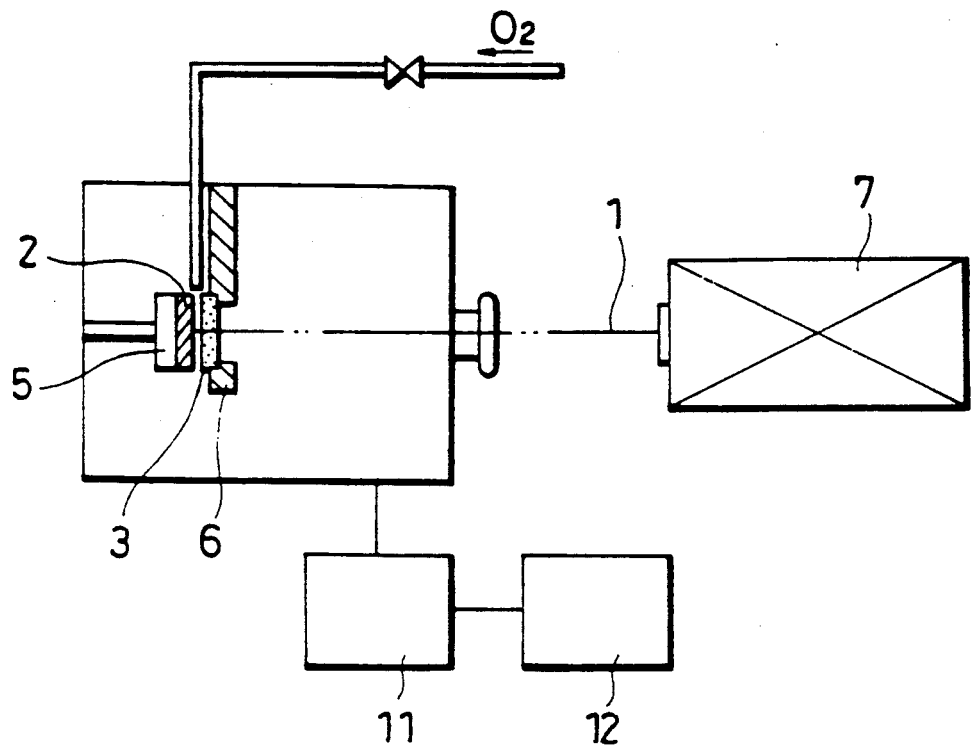
FIG. 1 is a schematic diagram illustrating a film forming method according to a preferred embodiment of the present invention.

FIG. 1 shows a typical example of a device to be preferably used in performing the manufacturing method according to the present invention. A target 2 having a predetermined oxide composition is retained by a target holder 5 movable in vertical and horizontal directions and rotatable. A substrate 3 is so provided as to face the target 2, and it is fixed by a substrate holder 6. A laser device 7 is provided on a normal with respect to a back surface of the substrate 3.

Accordingly, a laser beam 1 is irradiated from the side of the back surface of the substrate 3 and is transmitted through the substrate 3. The transmitted laser beam 1 is irradiated onto the target 2 to deposit an oxide of the target 2 onto the substrate 3, thus forming a thin film of the oxide.

The substrate 3 may be made of an oxide capable of transmitting a laser beam. Examples of such an oxide may include $MgO$, $SrTiO_3$, $LaAlO_3$, $LiNbO_3$, $LaGaO_3$, quartz glass, and sapphire.

The oxide target may be suitably selected according to a high-temperature superconductive oxide thin film to be manufactured. For example, in case of forming a superconductive thin film of Y oxide, $RBa_2Cu_3O_{7-\delta}$ (R: Y or La series elements) may be used. Alternatively, a superconductor of Bi or Tl oxide may be used as the oxide target.

According to the manufacturing method of the present invention, the target can be sufficiently approached to the substrate during film formation. Accordingly, even in the atmosphere of oxygen under an oxygen partial pressure remarkably higher than that in the prior art, the thin film can be formed under the condition that the plume can easily reach the substrate.

Accordingly, it is not necessary to perform a post-treatment of cooling and maintaining the thin film in the atmosphere of oxygen, but the superconductive thin film can sufficiently incorporate oxygen in a crystal structure. Further, since no twin plane is formed, it is possible to manufacture a thin film having a high Tc end and a high Jc and reducing a magnetic flux trap in the case that the thin film is applied to a superconductive device.

The oxygen partial pressure is set to preferably 10 mTorr-760 Torr. If it is less than 10 mTorr, the Tc improving effect does not sufficiently appear, while if it is more than 760 Torr, the film is undesirably deposited like powder. More preferably, the range of the oxygen partial pressure is set to 100 mTorr-100 Torr.

According to the present invention, it is not necessary to employ any special heating device such as a heater as employed in the prior art, so as to heat the substrate. That is, a laser absorbing film is formed on a subject surface or a back surface of the substrate, so that the substrate is heated by the laser beam while it is being transmitted through the substrate. At the same time the irradiation of the laser beam is ended, the substrate is rapidly cooled. A film thickness of the laser absorbing film is set to preferably 0.1-10 μm. If the film thickness is too small, laser absorption is insufficient, and the temperature of the substrate is not raised. If the film thickness is too large, a crystal property is deteriorated to undesirably cause separation of the film.

Figure 7:
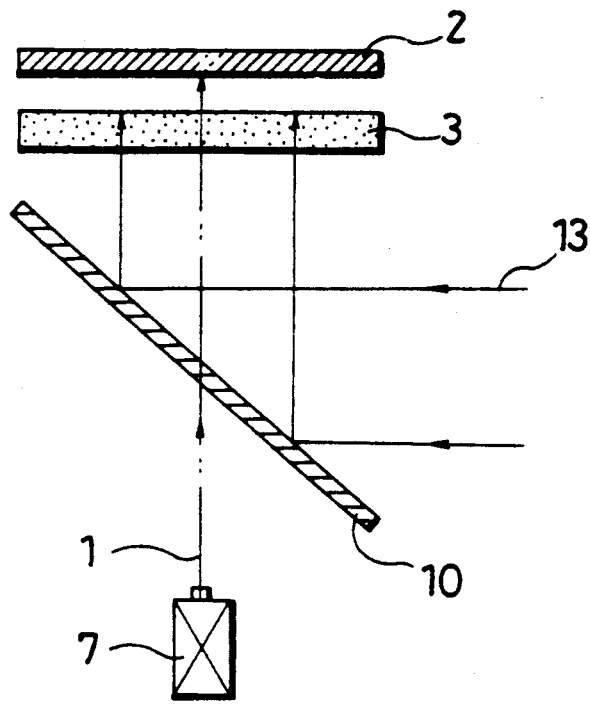

In substitution for the formation of the laser absorbing film, an infrared ray may be irradiated to heat the substrate. If it is difficult to identify an irradiating direction of the laser beam with that of the infrared ray because of the magnitudes of a laser source and an infrared light source, it is recommended that a multi-layer film mirror 10 capable of transmitting the laser beam 1 and reflecting the infrared ray 13 is employed and located as shown in FIG. 7, so that the laser beam and the infrared ray can be irradiated onto the substrate in the same direction.

Further, since the distance between the substrate and the target can be made as small as possible, the thin film can be formed at high speeds greater by three orders than the speed in the prior art, and the target material can be formed into the thin film on the substrate with a high probability to improve a deposition efficiency.

Further, while the laser beam is being transmitted through the substrate, the subject surface of the substrate can be cleaned by a photochemical reaction.

Additionally, since the post-treatment after film formation is not necessary, a manufacturing time can be widely reduced, and the oxygen to be used in the post-treatment can be saved.

EXAMPLE 1

Using a YAG laser device as the laser device in the apparatus shown in FIG. 1 and irradiating a laser beam having a wavelength of 355 nm (third higher harmonic), a superconductive thin film of Y oxide was formed under the test conditions shown in Table 1. As the oxide target, $YBa_2Cu_3O_{7-\delta}$ was used. The measurement results of a film thickness, Tc end and Jc at a practical temperature of 77K are shown in Table 1.

Figure 2:
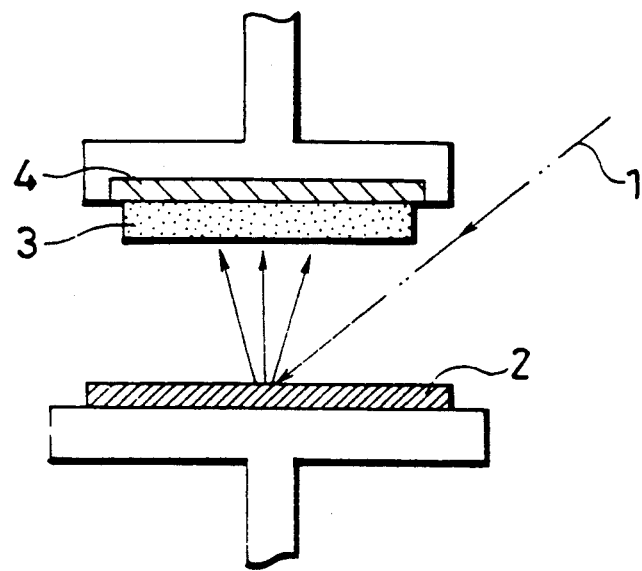
FIG. 2 is a schematic diagram illustrating a film forming method in the prior art.

Further, as a comparison, using a laser device similar to that used in Example 1, a thin film was formed by the conventional typical method as shown in FIG. 2. The test conditions and the evaluation results in the comparison are also shown in Table 1.

TABLE 1

|  | Example 1 | Comparison |
|---|---|---|
| (Test Conditions) | | |
| Substrate | MgO (100) (*) | MgO (100) |
| Heating of Substrate | (1) | (2) |
| Oxygen Partial Pressure (Torr) | 10 | 0.1 |
| Target-Substrate Distance (mm) | 3 | 50 |
| Laser Shot Number | 1 | $1 \times 10^3$ |
| Laser Enery Density (J/cm²) | 3 | 3 |
| Cooling Method | (*1) | (*2) |

TABLE 1-continued

|  | Example 1 | Comparison |
|---|---|---|
| (Evaluation Results) | | |
| Film Thickness (Å) | 300 | 300 |
| Film Forming Speed (Å/shot) | 300 | 0.3 |
| Tc end (K) | 90 | 90 |
| Jc (A/cm²) | $3 \times 10^6$ | $2.5 \times 10^6$ |

\*: $SrTiO_3$ film of 5 μm thick is formed as a laser absorbing film.
\*\*1: heating by laser irradiation
\*\*2: heating by heater at 700° C.
\*\*\*1: natural rapid cooling after heating by laser irradiation
\*\*\*2: gradual cooling in the atmosphere of oxygen additionally added under 300 Torr According to Example 1, the thin film can be formed at a high speed greater by three orders than that in Comparison. Moreover, Tc end in Example 1 is equal to that in Comparison, and Jc in Example 1 is higher than that in Comparison.

The high film forming speed means that the film thickness per pulse is large, and it is understood that a utilization efficiency of the target can be improved.

Figure 3:
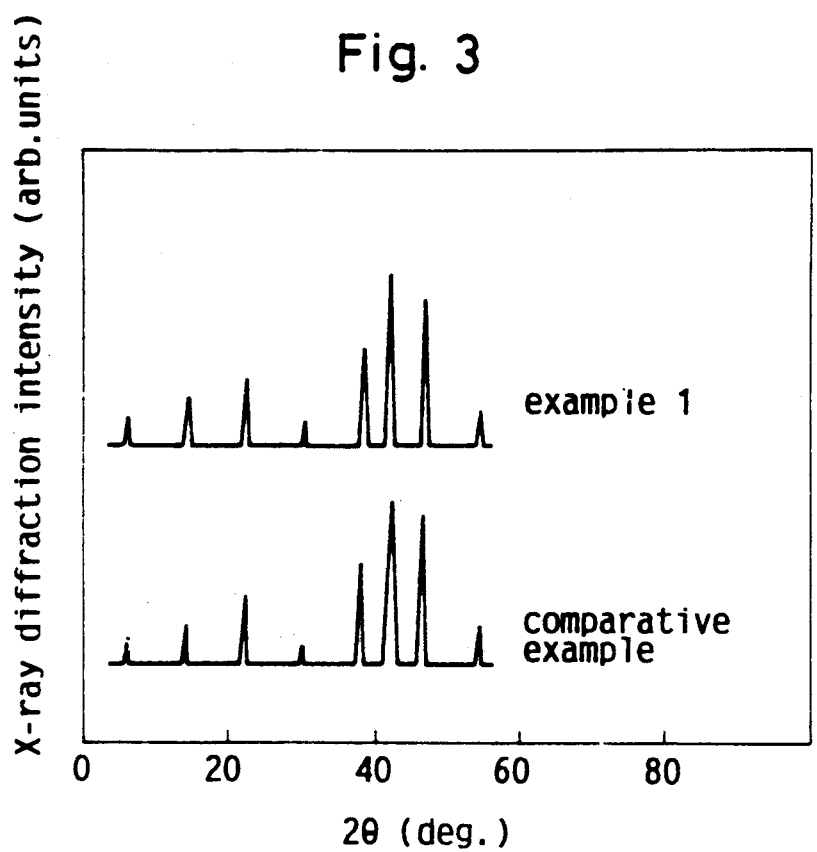
FIGS. 3 and 4 are graphs illustrating the results of X-ray diffraction according to the preferred embodiment in comparison with the prior art.

FIG. 3 shows the result of X-ray diffraction of the films obtained in Example 1 and Comparison. It is understood that the crystal is well oriented in the direction of the C-axis in both Example 1 and Comparison.

Figure 4:
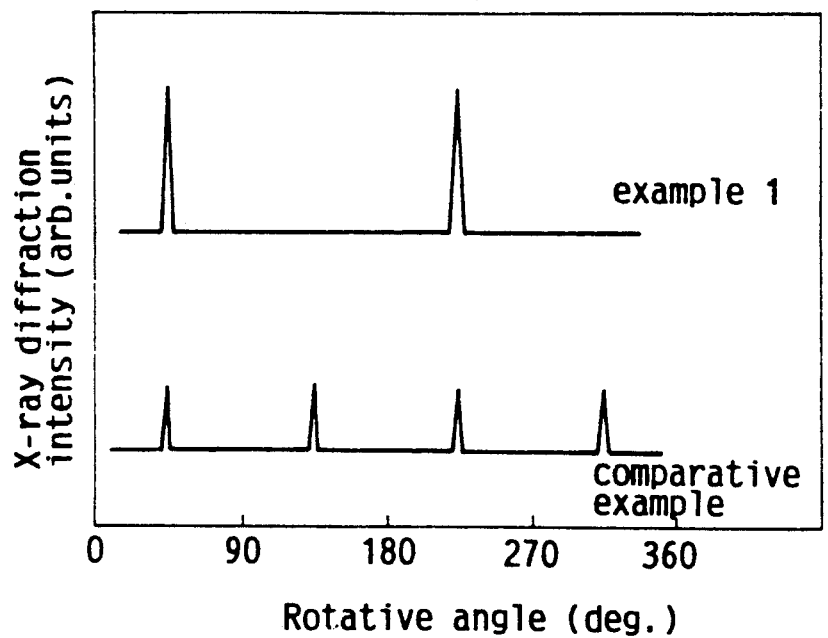

FIG. 4 shows the result of X-ray diffraction obtained by rotating a sample in the film plane and examining the orientation in the film plane. The test was performed by measuring a reflected X-ray from the (017) plane at $\theta = 7$ deg. (fixed) and $2\theta = 30.15$ deg. (fixed). As apparent from FIG. 4, the peaks appear at the intervals of 90 deg. in Comparison. It is understood from this result that the a-axis is oriented in two directions in the film plane at the intervals of 90 deg. and that a twin plane is present. To the contrary, in Example 1, the peaks appear at the intervals of 180 deg. It is understood from this result that the a-axis is oriented in one direction in the film plane and that no twin plane is present.

The reason why no twin plane is formed in Example 1 may be explained in the following manner. That is, since the film is formed under the very high oxygen partial pressure, the crystal structure becomes an orthorhombic system during the film formation. Furthermore, after the laser pulse is transmitted through the substrate, the substrate is naturally rapidly cooled. Therefore, it is considered that the oxygen in the film does not come out and no strain is accordingly generated in the crystal structure.

EXAMPLE 2

It is anticipated that the subject surface of the substrate is cleaned by a photochemical reaction upon transmitting of the laser beam through the substrate. To confirm this effect, the laser beam was transmitted through the substrate of MgO (100) without being irradiated onto the target under the conditions of vacuum of $10^{-7}$ Torr, laser irradiation power density of 3.0 J/cm² and laser pulse number of 1. The states of the subject surface of the substrate before and after the irradiation of the laser beam were observed and compared with each other by using RHEED (reflection high-energy electron diffraction). The result is shown in FIG. 5.

Figure 5:
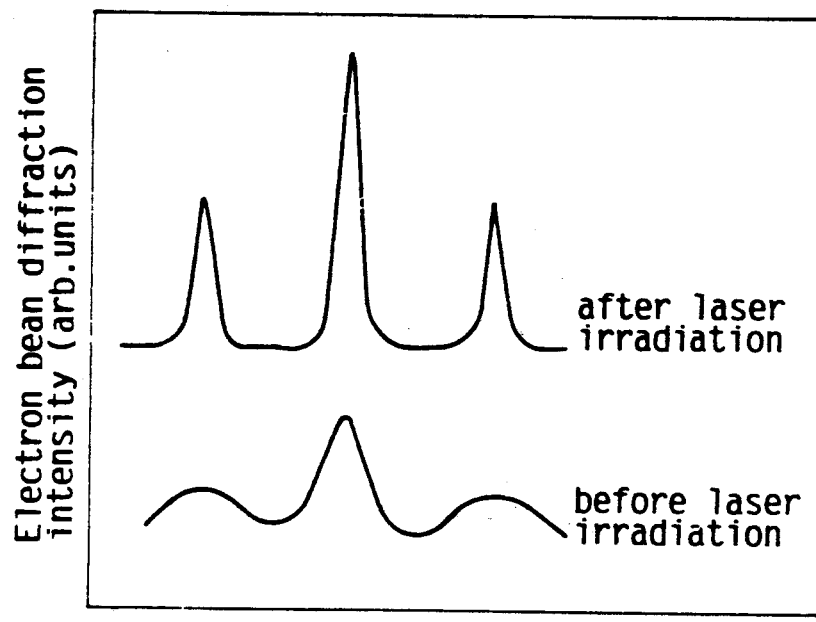
FIG. 5 is a graph illustrating the result of electron beam diffraction of a substrate before and after laser irradiation.

As apparent from FIG. 5, after the irradiation of the laser beam, a diffraction intensity becomes large, which proves that the substrate has been cleaned.

EXAMPLE 3

The film formation was carried out under the same conditions as those in Example 1 with the exception that quartz glass was used as the substrate and that the substrate was heated to 700° C. by a heater without forming a laser absorbing film. In Example 3, Jc was $3 \times 10^5$ A/cm$^2$, and all of the film thickness, the film forming speed and Tc end were similar to those in Example 1.

While the thin film obtained was a polycrystal rather than a single crystal, it may be formed into a microbridge, which may be applied to an electromagnetic wave sensor by utilizing a weak bond between the superconductive crystals.

EXAMPLE 4

Figure 6:
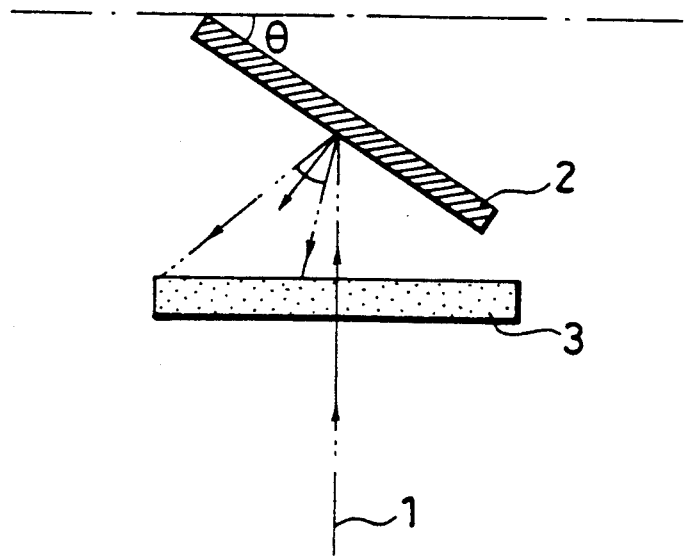
FIGS. 6 and 7 are schematic diagrams illustrating film forming methods according to other preferred embodiments of the present invention.

The film formation was carried out by irradiating the laser beam 1 of 10 pulses in the same manner as that in Example 1 with the exception that the target 2 was inclined to the substrate 3 at a predetermined angle $\theta$ as shown in FIG. 6. The characteristics of the thin film formed were evaluated to obtain the results similar to those in Example 1.

According to this method, the thin film is not formed at a laser transmitted portion on the subject surface of the substrate. Accordingly, the laser beam can be continuously irradiated, so that the thin film can be formed in a wide range by moving the substrate.

EXAMPLE 5

Figure 8:
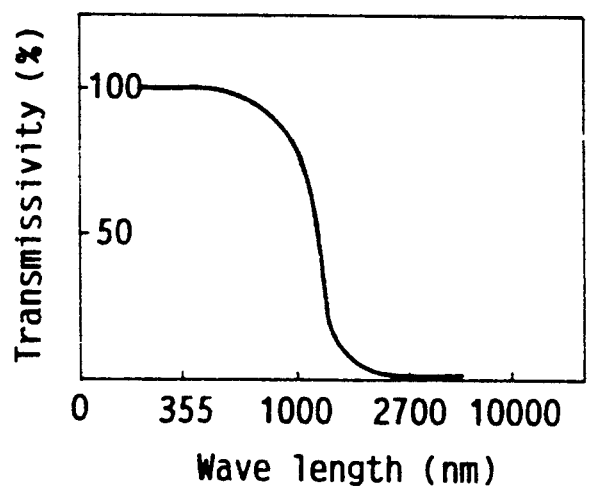
FIG. 8 is a graph illustrating a characteristic of a multi-layer film mirror employable in the present invention.

The film formation was carried out in the same manner as that in Example 1 with the exception that a laser absorbing film was not formed on the substrate 3, but a multi-layer film mirror 10 was located between the substrate 3, and the laser device 7 as shown in FIG. 7. That is, an infrared ray 13 having a wavelength of 2700 nm was reflected on the multi-layer film mirror 10 to heat the substrate 3. The characteristics of the thin film formed were evaluated to obtain the results similar to those in Example 1. The multi-layer film mirror 10 is capable of transmitting a laser beam (355 nm) and reflecting an infrared ray (2700 nm), and it has a characteristic shown in FIG. 8.

Further, using sapphire, SrTiO$_3$, LaAlO$_3$, LiNbO$_3$ and LaGaO$_3$ as the substrate, the film formation was carried out in the same manner as the above, and the characteristics of the thin film formed were evaluated to obtain the results similar to those in Example 1.

INDUSTRIAL APPLICABILITY

According to the present invention, it is not necessary to perform a post-treatment of cooling and maintaining a thin film in the atmosphere of oxygen after film formation. The subject surface of the substrate is cleaned during the film formation, and the high-temperature superconductive oxide thin film can be manufactured at high speeds.

We claim:

1. In a method for the preparation of a high-temperature superconductive oxide film by irradiating a laser beam onto an oxide target in an atmosphere of oxygen to form said high-temperature superconductive oxide film on an oxide substrate, the improvement comprising that said laser beam is irradiated from a back surface of said substrate and is transmitted through said substrate, and thereafter said laser beam is irradiated onto said oxide target to deposit oxide target material on said substrate.

2. The method as defined in claim 1, wherein said high-temperature superconductive oxide film is formed in the atmosphere of oxygen under an oxygen partial pressure of 10 mTorr–760 Torr.

3. The method as defined in claims 1 or 2, wherein an oxide film as a laser absorbing film is formed on a surface of said oxide substrate, so that said substrate is heated by transmitting said laser beam through said substrate, and is rapidly cooled by stopping irradiation of said laser beam.

4. The method as defined in claims 1 or 2, wherein said oxide substrate is additionally heated by irradiation with an infrared ray.

5. The method as defined in claims 1 or 2, wherein said oxide substrate is selected from the group consisting of SrTiO$_3$, LaAlO$_3$, LiNbO$_3$, LaGaO$_3$, MgO, quartz glass and sapphire.

6. The method as defined in claims 1 or 2, wherein said high-temperature superconductive oxide film is RBa$_2$Cu$_3$ oxide wherein R is a Y or La series element.

* * * * *